United States Patent
Darabi et al.

(10) Patent No.: US 7,429,891 B2
(45) Date of Patent: Sep. 30, 2008

(54) METHOD AND SYSTEM FOR LOW NOISE AMPLIFIER (LNA) GAIN ADJUSTMENT THROUGH NARROWBAND RECEIVED SIGNAL STRENGTH INDICATOR (NRSSI)

(75) Inventors: Hooman Darabi, Irvine, CA (US); Henrik T. Jensen, Long Beach, CA (US); Brima Ibrahim, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 373 days.

(21) Appl. No.: 10/977,868

(22) Filed: Oct. 29, 2004

(65) Prior Publication Data

US 2006/0091948 A1 May 4, 2006
US 2007/0164820 A9 Jul. 19, 2007

Related U.S. Application Data

(63) Continuation-in-part of application No. 10/367,492, filed on Feb. 14, 2003, now Pat. No. 7,215,703.

(51) Int. Cl.
*H03G 5/16* (2006.01)
(52) U.S. Cl. ............... 330/132; 330/291; 330/278; 330/302; 455/232.1
(58) Field of Classification Search ............ 330/132, 330/291, 278, 302; 455/232.1
See application file for complete search history.

(56) References Cited

U.S. PATENT DOCUMENTS

| 5,657,026 | A | * | 8/1997 | Culpepper et al. | 342/374 |
| 6,057,735 | A | * | 5/2000 | Cloutier | 330/279 |
| 6,327,312 | B1 | * | 12/2001 | Jovanovich et al. | 375/316 |
| 6,873,832 | B2 | * | 3/2005 | Shi | 455/232.1 |
| 2004/0161026 | A1 | * | 8/2004 | Jensen et al. | 375/224 |

* cited by examiner

*Primary Examiner*—Patricia Nguyen
(74) *Attorney, Agent, or Firm*—McAndrews, Held & Malloy, Ltd.

(57) ABSTRACT

Methods and systems for processing a plurality of signals are disclosed herein. Aspects of the method may comprise amplifying an input signal. The amplified input signal may be bandpass filtered. Amplification of the input signal may be adjusted based on only narrowband received signal strength indication of the bandpass filtered amplified input signal. The amplified input signal may be downconverted and a blocker signal may be bandpass filtered from the amplified input signal. Signal strength of a desired signal from the amplified input signal may be measured. The amplification of the input signal may be adjusted utilizing a triple well (TW) NMOS transistor. A control signal may be generated based on the narrowband received signal strength indication of the bandpass filtered amplified input signal. The amplification of the input signal may be adjusted based on at least one of the generated control signals.

21 Claims, 8 Drawing Sheets

METHOD AND SYSTEM FOR LOW NOISE AMPLIFIER (LNA) GAIN ADJUSTMENT THROUGH NARROWBAND RECEIVED SIGNAL STRENGTH INDICATOR (NRSSI)

RELATED APPLICATIONS

This application is a continuation-in-part of U.S. application Ser. No. 10/367,492, filed Feb. 14, 2003 now U.S. Pat. No. 7,215,703, and titled "Digital Calculation of Received Signal Strength Indication."

This application is related to the following applications, each of which is incorporated herein by reference in its entirety for all purposes:

U.S. patent application Ser. No. 10/976,976 filed Oct. 29, 2004;
U.S. patent application Ser. No. 10/976,977 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,464 filed Oct. 29, 2004;
U.S. patent application Ser. No. 10/977,798 filed Oct. 29, 2004;
U.S. patent application Ser. No. 10/977,005 filed Oct. 29, 2004;
U.S. patent application Ser. No. 10/977,771 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004; and
U.S. patent application Ser. No. 10/976,996 filed Oct. 29, 2004.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to the processing of radio signals in a transceiver. More specifically, certain embodiments of the invention relate to a method and system for low noise amplifier (LNA) gain adjustment through narrowband received signal strength indicator (NRSSI).

BACKGROUND OF THE INVENTION

Modern communication devices, such as radio frequency (RF) communication devices, process electromagnetic wave signals with variable signal strength. The variable signal strength varies depending on distance between a transmitter and a receiver, as well as environmental factors and process, temperature etc. variations (PVT). A power amplifier (PA) is utilized prior to signal transmission by a transmitter, for example, and a variable gain low noise amplifier (LNA) is utilized after a signal is received by a receiver, to amplify the signal and adjust the signal gain accordingly. Conventional gain control circuits in a signal amplifying device, however, do not improve the linearity of the PA and/or LNA that is utilized for signal amplification.

Different gain control techniques are utilized by conventional gain control circuits in signal amplifying devices without accounting for PVT. For example, amplifier gain in a conventional LNA or PA devices is varied by changing the resistance of one or more resonance tanks in the conventional LNA or PA. A resonance tank may comprise one or more LC circuits, for example, adapted to resonate at a determined frequency. By changing the inductance (L) and/or capacitance (C) of the LC tank, the overall tank resistance may be changed and, as a result, the LNA's or PA's gain may be changed as well. This technique, however, does not compensate for gain variations in the core amplifier circuit due to PVT.

Other conventional gain control techniques utilize PMOS transistor switches to implement low gain and high gain amplification within an exemplary LNA or PA. For example, if the PMOS transistor is turned off, high gain control may be applied by the exemplary LNA or PA. Similarly, if the PMOS transistor is turned on, low gain control may be applied by the LNA or PA. PMOS transistors utilized in conventional variable gain LNA and PA devices, however, cause high parasitic capacitance and increase overall device non-linearity since variations, such as PVT, in the core amplifying circuit are not tracked during an operation cycle. As a result, non-linearity decreases amplifier sensitivity and contributes to the creation of intermodulation (IM) products in the desired signal passband.

Amplifier circuits utilizing a conventional variable gain LNA comprise one or more downconversion mixers followed by a bandpass filter. After a signal is amplified by the variable gain LNA, it may be downconverted by the downconversion mixer, preserving the wideband signal characteristics of the amplified signal. The signal may then be bandpass filtered resulting in a narrow band signal. To improve the LNA sensitivity and increase amplifier linearity, conventional circuits utilize received signal strength indicators (RSSI) after an incoming signal is communicated from the LNA. The received signal strength indicators may provide gain control feedback signals to the LNA for gain adjustment. Such received signal strength indicators, however, require circuits that utilize significant on-chip real estate. In addition, in order to obtain good gain control feedback signal, an amplifier circuit requires numerous received signal strength indicators.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Certain embodiments of the invention may be found in a method and system for processing a plurality of signals. Aspects of the method may comprise amplifying an input signal. The amplified input signal may be bandpass filtered. Amplification of the input signal may be adjusted based on only narrowband received signal strength indication of the bandpass filtered amplified input signal. The amplified input signal may be downconverted and a blocker signal may be bandpass filtered from the amplified input signal. Signal strength of a desired signal from the amplified input signal may be measured.

The amplification of the input signal may be adjusted utilizing a triple well (TW) NMOS transistor. A control signal may be generated based on the narrowband received signal strength indication of the bandpass filtered amplified input signal. The amplification of the input signal may be adjusted based on at least one of the generated control signals. The generated control signal may correspond to a powering state of a TW NMOS transistor. If the measured signal strength is below a first threshold value, the input signal may be amplified utilizing a determined first gain of a low noise amplifier (LNA). If the measured signal strength is above a first threshold value and below a second threshold value, the input signal may be amplified utilizing a determined second gain of a low noise amplifier (LNA).

Aspects of the system may comprise a low noise amplifier (LNA) that amplifies an input signal. The amplified input signal may be bandpass filtered by a bandpass filter. The LNA may adjust amplification of the input signal based on only a narrowband received signal strength indication of the bandpass filtered amplified input signal. A downconversion mixer may downconvert the amplified input signal and a bandpass filter may filter a blocker signal from the amplified input signal. A received signal strength indicator block may measure signal strength a desired signal from the amplified input signal.

The LNA may adjust the amplification of the input signal utilizing a triple well (TW) NMOS transistor. The received signal strength indicator block may generate a control signal based on the narrowband received signal strength indication of the bandpass filtered amplified input signal. The LNA may adjust the amplification of the input signal based on the generated at least one control signal, where the generated control signal may correspond to a powering state of a triple well (TW) NMOS transistor. If the measured signal strength is below a first threshold value, the LNA may amplify the input signal utilizing a determined first gain. If the measured signal strength is above a first threshold value and below a second threshold value, the LNA may amplify the input signal utilizing a determined second gain. The LNA may comprise a triple well (TW) NMOS transistor that tracks process and temperature variations (PVT).

These and other features and advantages of the present invention may be appreciated from a review of the following detailed description of the present invention, along with the accompanying figures in which like reference numerals refer to like parts throughout.

DETAILED DESCRIPTION OF THE INVENTION

Certain embodiments of the invention may be found in a circuit for processing signals, such as a signal amplifying circuit. The signal amplifying circuit may comprise an amplifier core and one or more NMOS transistors, such as triple well (TW) NMOS transistors, may be coupled to the core and utilized for gain control. In accordance with an aspect of the invention, a TW NMOS transistor may be utilized to track process and temperature variations (PVT) of at least one NMOS transistor within the amplifier core in a LNA and/or a PA. Since a LNA and/or PA amplifier core comprises NMOS transistors, an NMOS transistor utilized as a switch outside the core, may track the transconductance $g_m$ as well as other variations, such as PVT, within the core NMOS transistors. A LNA or a PA utilizing an NMOS transistor switch, such as TW NMOS, is characterized by a well defined high and low gain as the TW NMOS may be adapted to track PVT within core NMOS devices.

By using TW NMOS switch in a LNA and/or a PA, parasitic capacitance may be decreased, amplifier sensitivity may be significantly improved, and gain values may be well defined. For example, a minimum gain may be well defined for a large interference/blocker signal and maximum gain may be well defined for a small desired signal. In another aspect of the invention, multiple NMOS transistors may be utilized as switches resulting in multiple well-defined gain values for a LNA and/or a PA. An amplifier circuit utilizing a LNA with a TW NMOS transistor switch and well defined gain may utilize only a single narrowband received signal strength indicator (NRSSI). The NRSSI may be determined after a bandpass filter, for example, after an amplified signal from the LNA is downconverted and filtered. The NRSSI may be utilized to generate a gain control signal based on a signal strength of a desired signal within the received signal.

In yet another aspect of the invention, an NRSSI circuit may be utilized in accordance with a LNA in a receiver circuit adapted to receive GSM signals, for example. In accordance with GSM specification standards, if the receiver circuit receives a desired signal accompanied by a large interference/blocker signal, the GSM receiver noise may be relaxed by at least 3 dB, since the received desired signal is at least 3 dB stronger. If the LNA mid-gain step is well defined, by using TW NMOS switches, for example, sufficient margin may be allowed for PVT variations. In this case, if the LNA gain is well defined, detecting the desired signal through NRSSI only may be sufficient to reduce the LNA gain to a mid-gain step to tolerate more blocking and to improve overall linearity.

Figure 1:
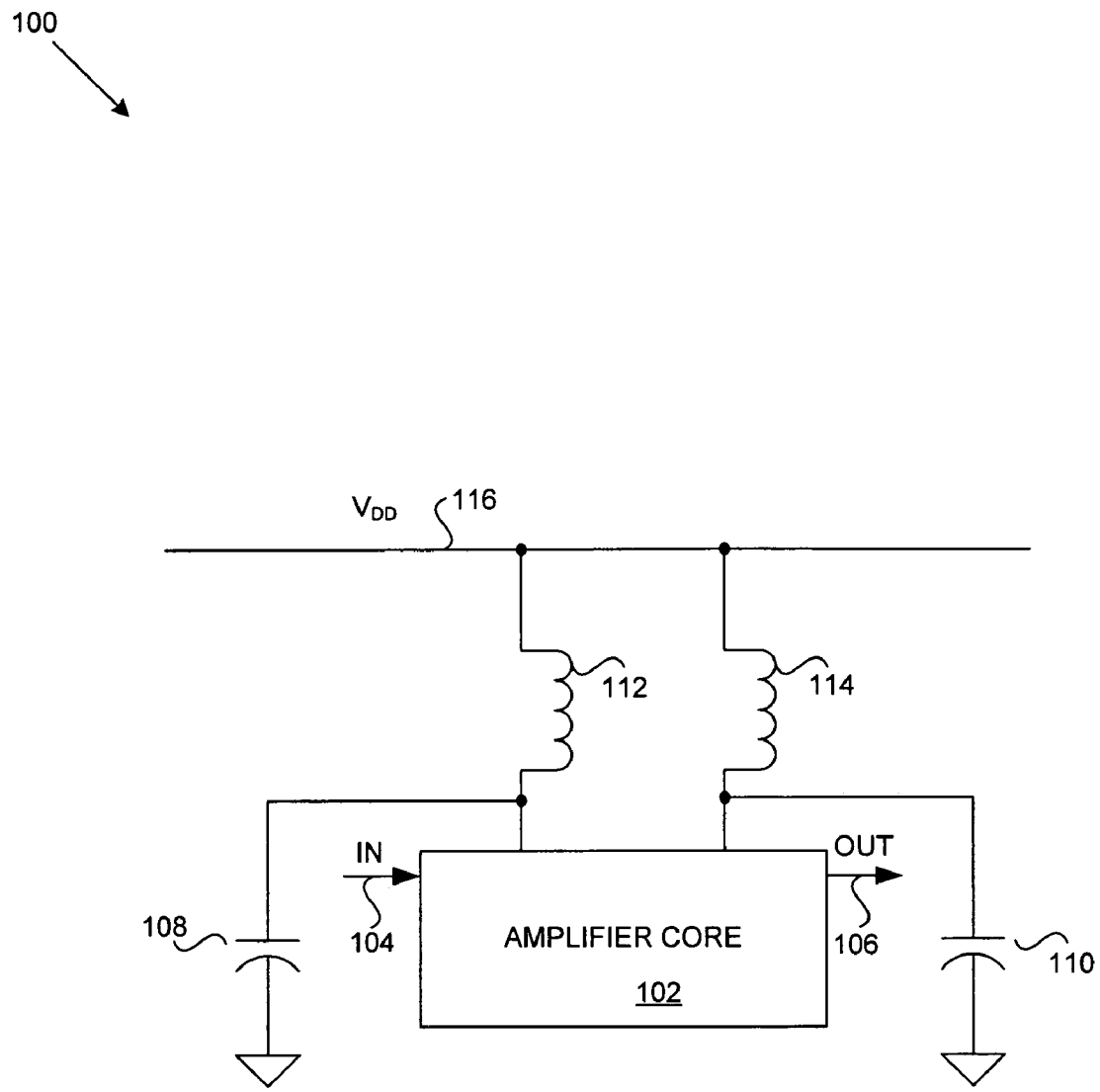
FIG. 1 is a circuit illustrating an amplifier circuit that may be utilized in connection with an embodiment of the invention.

FIG. 1 is a circuit illustrating an amplifier circuit 100 that may be utilized in connection with an embodiment of the invention. Referring to FIG. 1, the amplifier circuit 100 may comprise an amplifier core 102, inductors 112 and 114, capacitors 108 and 110, and a voltage supply rail 116. In operation, the LC-tank comprising inductor 112 and capacitor 108 and/or the LC-tank comprising inductor 114 and capacitor 110 may be tuned to a resonance frequency $f_0$ and may limit the bandwidth of the incoming signal 104. For example, the LC-tank comprising inductor 112 and capacitor 108 and/or the LC-tank comprising inductor 114 and capacitor 110 may be tuned to resonate at approximately 900 MHz for an incoming GSM signal 104. The amplifier core 102 may comprise suitable circuitry or logic and may be adapted to amplify the incoming signal 104 to generate an output signal 106.

In one aspect of the invention, the LC-tank comprising inductor 112 and capacitor 108 and/or the LC-tank comprising inductor 114 and capacitor 110 may be replaced by corresponding load resistors and gain within the amplifier core 102 may be changed by proportionally changing the resistance of the load resistors. For example, high gain may be achieved with a high load resistance and lower gain may be achieved by a lower load resistance. High amplifier sensitivity and well defined gain of the amplifier circuit 100 may be achieved by using a triple well (TW) NMOS transistor as a load, as further explained herein below.

The amplifier circuit 100 may be utilized for signal amplification immediately after a signal is received by a receiver, for example. In addition, the amplifier circuit 100 may also be utilized to amplify a signal prior to transmission. Depending on the particular application, the amplifier core 102 may be utilized with additional circuitry, such as a mixer, to downconvert or upconvert a signal, if the amplifier circuit 100 is used in a receiver LNA or a transmitter PA, respectively.

Figure 2:
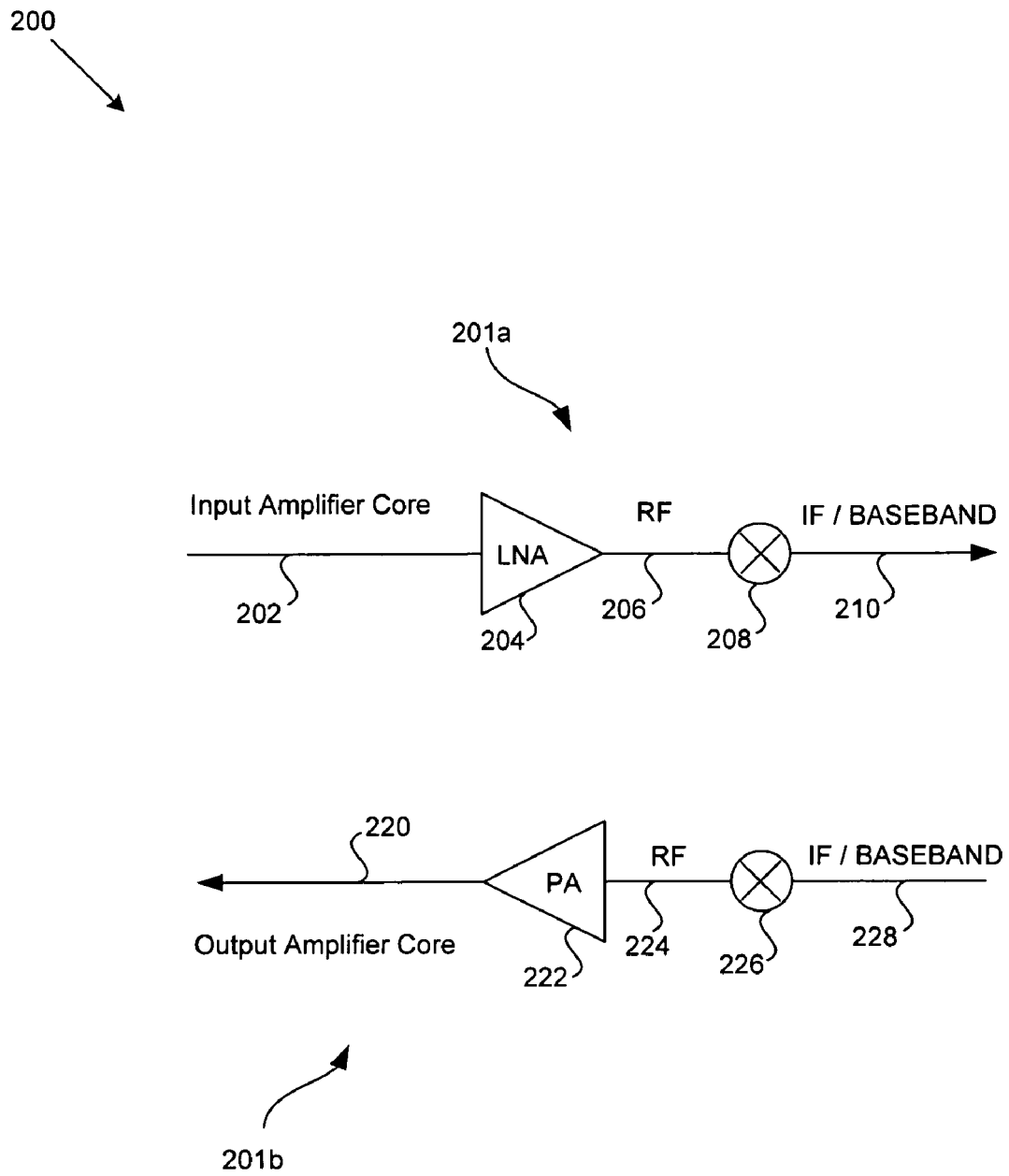
FIG. 2 is a circuit diagram illustrating exemplary low noise amplifier (LNA) and power amplifier (PA) circuits that may be utilized in connection with an embodiment of the invention.

FIG. 2 is a circuit 200 illustrating exemplary low noise amplifier (LNA) 201a and power amplifier (PA) 201b circuits that may be utilized in connection with an embodiment of the invention. Referring to FIG. 2, the exemplary LNA amplifier circuit 201a may comprise a LNA 204 and a downconversion mixer 208. The exemplary PA amplifier circuit 201b may comprise a PA 222 and an upconversion mixer 226.

The LNA 204 in the LNA amplifier circuit 201a may comprise suitable circuitry and/or code and may be adapted to receive an input signal 202 and generate an amplified RF signal 206. The LNA 204 may be also adapted to adjust the gain of the input signal 202 in accordance with one or more gain control signals, for example. In one aspect of the invention, the LNA 204 may comprise one or more NMOS transistors, such as TW NMOS transistors, that may be utilized by the amplifier core as a switch for triggering different gain levels. For example, a TW NMOS transistor utilized by the LNA 204 may be adapted to be turned on and off in accordance with the gain control signal, triggering low and high gain, respectively.

The downconversion mixer 208 may comprise suitable circuitry and/or logic and may be adapted to receive the RF signal 206 and downconvert it to an intermediate frequency (IF)/baseband signal 210. The IF/baseband signal 210 may then be further filtered and/or amplified.

In operation, the LNA 204 may receive the incoming signal 202 and may amplify it in accordance with one or more gain control signals communicated to the LNA 204. Well defined gain levels and reduced parasitic capacitance within the LNA 204 may be achieved by using a TW NMOS transistor as a switch. In this manner, by utilizing a gain control signal corresponding to a power status of the TW NMOS transistor, the LNA 204 may apply a maximum gain, if the input signal 202 comprises a weak desired signal, or a minimum gain, if the input signal 202 comprises a strong interference/blocker signal. After the LNA 204 amplifies the input signal 202 and generates the RF signal 206, the downconversion mixer 208 may downconvert the RF signal 206 to IF/baseband signal 210. The IF/baseband signal 210 may then be further processed by additional filtering and/or amplifying, for example.

The PA 222 in the PA amplifier circuit 201b may comprise suitable circuitry and/or code and may be adapted to receive an upconverted RF signal 224 and generate an amplified output signal 220. The PA 222 may be also adapted to adjust the gain of the RF signal 224 in accordance with one or more gain control signals, for example. In another aspect of the invention, the PA 222 may comprise one or more NMOS transistors, such as TW NMOS transistors, that may be utilized by the amplifier core as a switch for triggering different gain levels. For example, a TW NMOS transistor utilized by the PA 222 may be adapted to be turned on and off in accordance with the gain control signal, triggering low and high gain, respectively.

The upconversion mixer 226 may comprise suitable circuitry and/or logic and may be adapted to receive an IF/baseband signal 228 and upconvert it to an RF signal 224. After the RF signal 224 is amplified by the PA 222, it may be transmitted as an output signal 220.

In operation, an IF/baseband signal 228 may be upconverted by the upconversion mixer 226 to generate RF signal 224. The PA 222 may receive the incoming RF signal 224 and may amplify it in accordance with one or more gain control signals communicated to the PA 222. Well defined gain levels and reduced parasitic capacitance within the PA 222 may be achieved by using a TW NMOS transistor as a switch. In this manner, by utilizing a gain control signal corresponding to a power status of the TW NMOS transistor, the PA 222 may apply a maximum gain, if the input RF signal 224 comprises a weak desired signal, or a minimum gain, if the input RF signal 224 comprises a strong interference/blocker signal.

Figure 3:
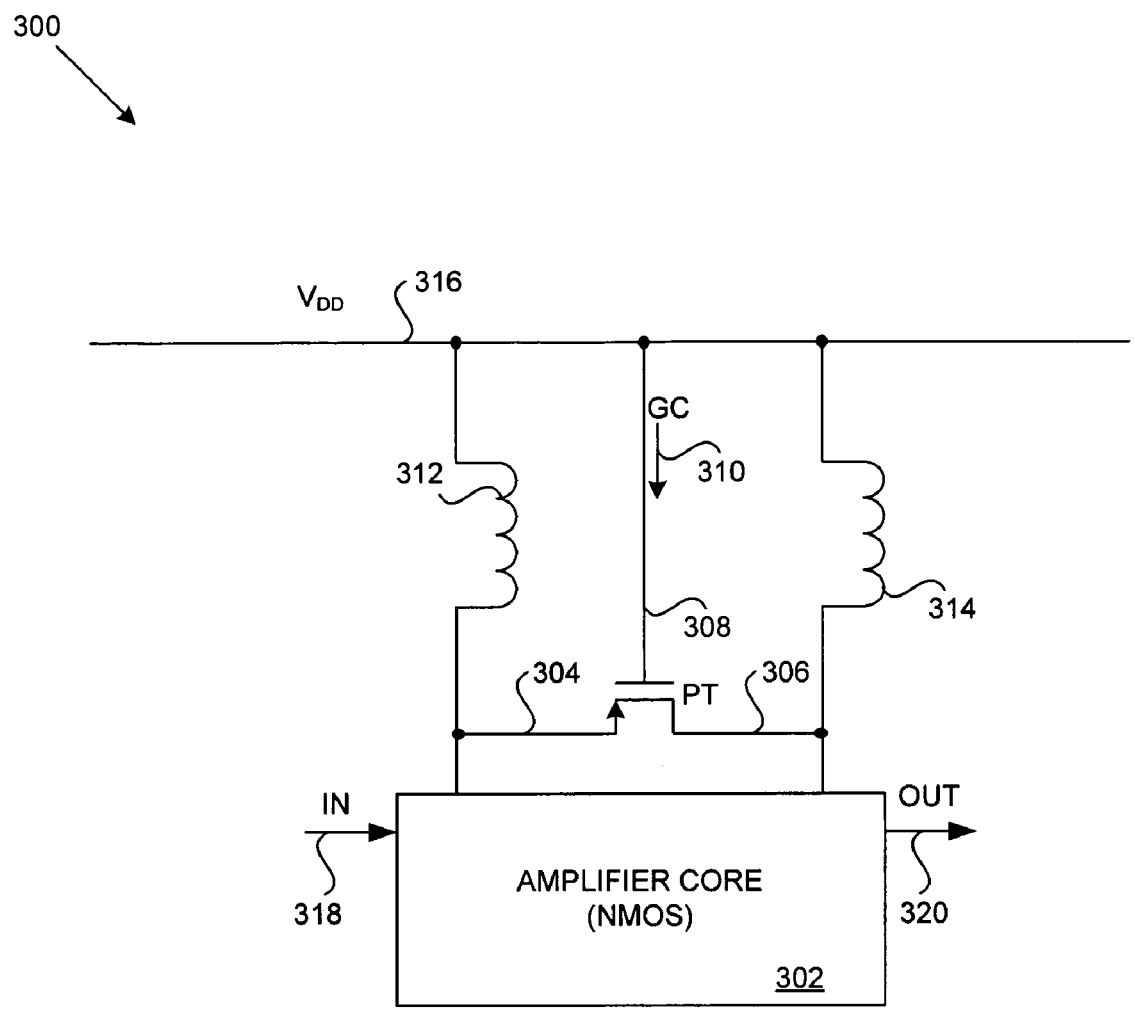
FIG. 3 is a circuit illustrating an exemplary amplifier circuit with a PMOS transistor switch that may be utilized in connection with an embodiment of the invention.

FIG. 3 is a circuit illustrating an exemplary amplifier circuit with a PMOS transistor switch that may be utilized in connection with an embodiment of the invention. Referring to FIG. 3, the amplifier circuit 300 may comprise inductors 312 and 314, PMOS transistor PT, and amplifier core 302. The amplifier core 302 may comprise suitable circuitry and/or logic and may be adapted to receive an incoming signal 318, amplify the received signal, and generate an output signal 320. For example, the amplifier core 302 may comprise one or more NMOS transistors that may be utilized for amplifying the input signal 318.

In one aspect of the invention, the amplifier core 302 may utilize PMOS transistor PT to control one or more gain levels of the amplifier core 302. The source 304 and drain 306 of transistor PT may be coupled to inductors 312 and 314, respectively. The gate 308 of transistor PT may be coupled to voltage rail 316. A gain control signal 310 may be asserted on the gate 308 to enable or disable the transistor PT and to assert low or high gain on the incoming signal 318.

In operation, the amplifier core 302 may receive the incoming signal 318. If the incoming signal 318 comprises a weak desired signal, the gain control (GC) signal 310 may be asserted, for example, GC set to logic 1, by connecting the gate 308 of transistor PT to voltage rail 316 with voltage $V_{DD}$. If the gain control signal 310 is asserted, the PMOS transistor PT will be turned off and the amplifier core 302 may assert high gain on the incoming signal 318. If the incoming signal 318 comprises a strong interference/blocker signal, the gain control signal 310 may be de-asserted, for example, GC set to logic 0, by turning off the gate 308 of transistor PT from voltage rail 316 with voltage $V_{DD}$. If the gain control signal 310 is de-asserted, the PMOS transistor PT will be turned on and the amplifier core 302 may assert low gain on the incoming signal 318.

Figure 5A:
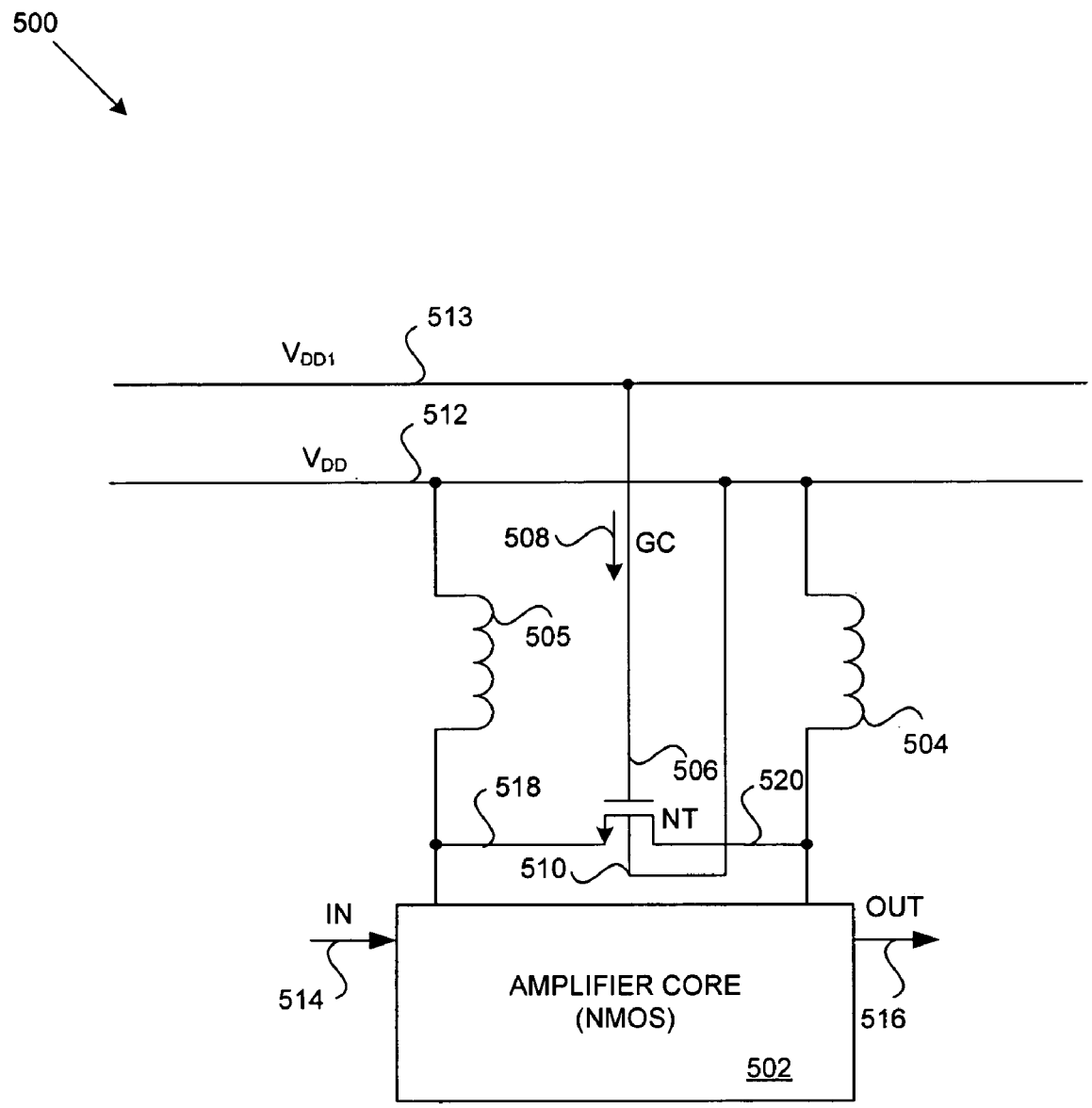
FIG. 5A is a circuit illustrating an amplifier circuit with a triple well (TW) NMOS transistor, in accordance with an embodiment of the invention.
Figure 5B:
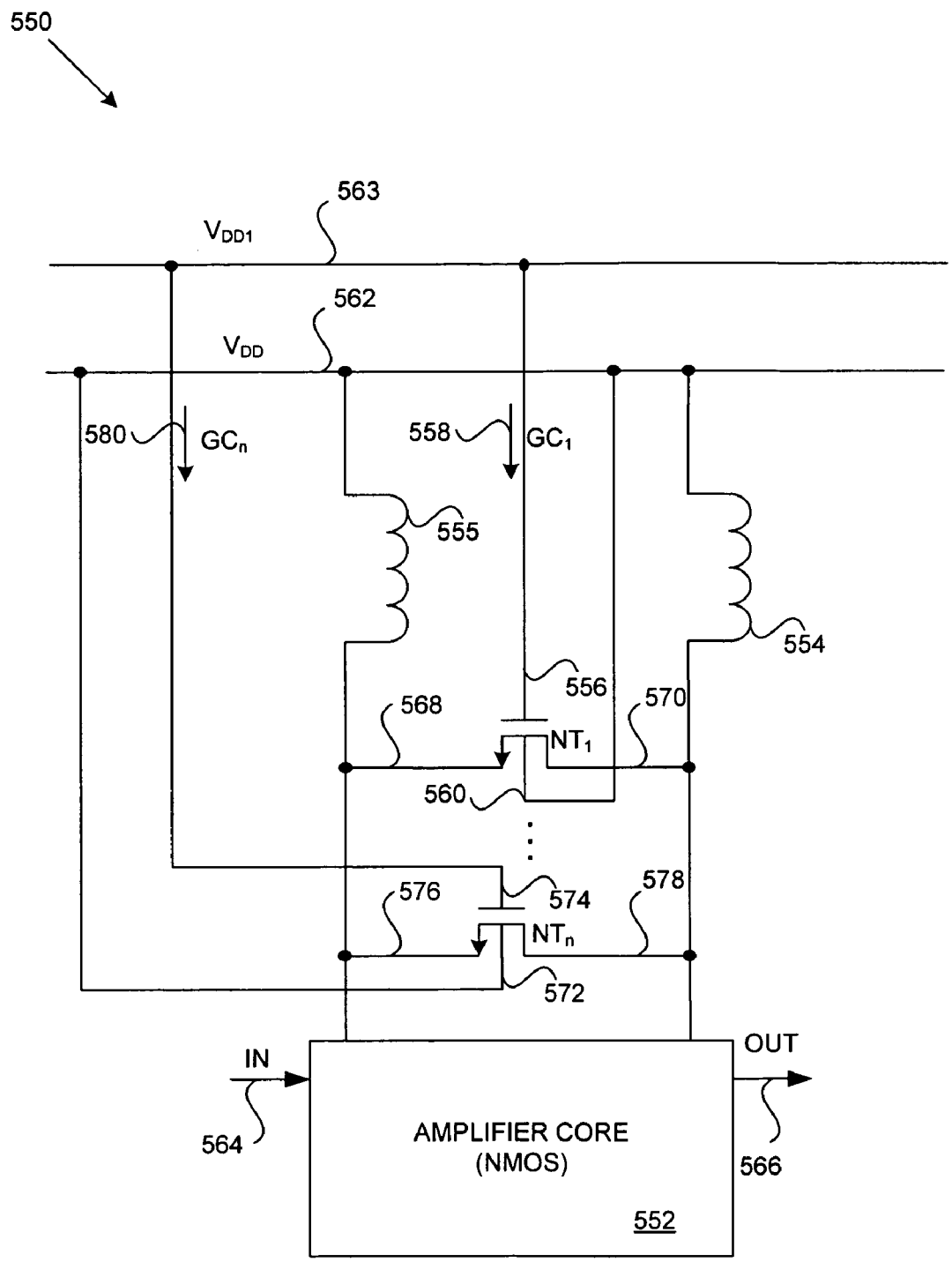
FIG. 5B is a circuit illustrating an amplifier circuit with a plurality of triple well (TW) NMOS transistors, in accordance with an embodiment of the invention.

In one aspect of the invention, parasitic capacitance within the amplifier circuit 300 may be reduced and sensitivity of the amplifier core 302 may be increased by utilizing an NMOS transistor, such as a triple well NMOS transistor, in place of the PMOS transistor PT as further explained with regard to FIGS. 5A and 5B.

Figure 4:
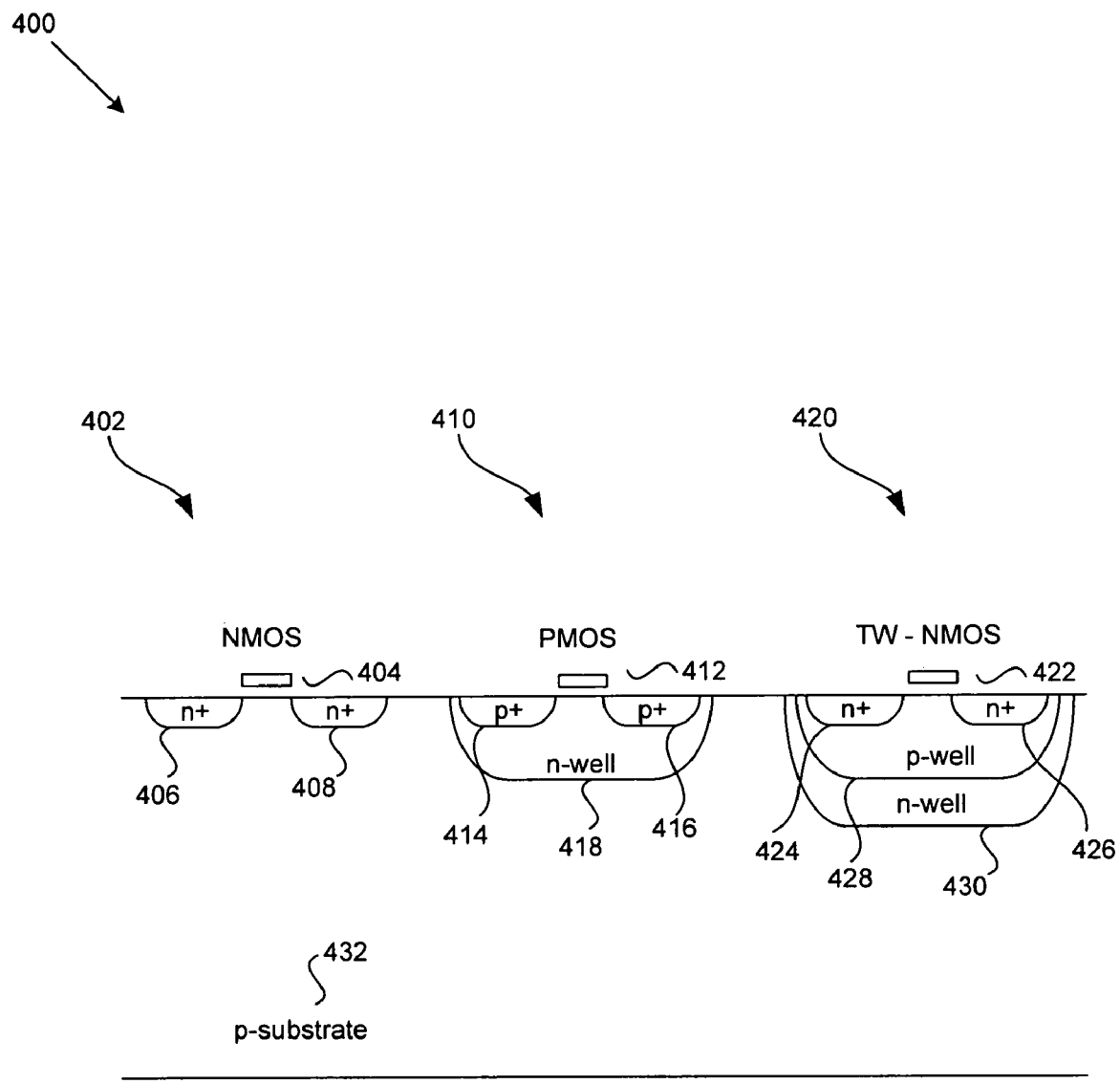
FIG. 4 is an exemplary circuit illustrating NMOS, PMOS, and triple well (TW) NMOS transistors that may be utilized in connection with an embodiment of the invention.

FIG. 4 is an exemplary circuit 400 illustrating NMOS, PMOS, and triple well (TW) NMOS transistors that may be utilized in connection with an embodiment of the invention. Referring to FIG. 4, there is illustrated an exemplary NMOS transistor 402, a PMOS transistor 410, and a TW NMOS transistor 420.

The NMOS transistor 402 may comprise a gate 404, a source 406, and a drain 408. The source 406 and the drain 408 may be implemented in a p-substrate 432. The PMOS transistor 410 may comprise a gate 412, a source 414, and a drain 416. The source 414 and the drain 416 may be implemented in an n-well 418, and the n-well 418 may be implemented in the p-substrate 432. The TW NMOS transistor 420 may comprise a gate 422, a source 424, and a drain 426. The source 424 and the drain 426 may be implemented in a p-well 428. The p-well 428 may be implemented in an n-well 430, and the n-well 430 may be implemented in the p-substrate 432.

The NMOS transistor 402, PMOS transistor 410, and TW NMOS transistor 420 may each be utilized as gain control switches in accordance with an amplifier circuit, such as a LNA and/or a PA circuit. The TW NMOS transistor 420, however, may be utilized to achieve low parasitic capacitance within the amplifier circuit, as well as increased gain control sensitivity. As a result, an amplifier circuit utilizing TW NMOS switch for gain control may be characterized with well defined high and/or low gain and improved amplifier linearity.

FIG. 5A is a circuit illustrating an amplifier circuit with a triple well (TW) NMOS transistor, in accordance with an embodiment of the invention. Referring to FIG. 5A, the amplifier circuit 500 may comprise inductors 505 and 504, a TW NMOS transistor NT, and an amplifier core 502. The amplifier core 502 may comprise suitable circuitry and/or logic and may be adapted to receive an incoming signal 514, amplify the received signal, and generate an output signal 516. For example, the amplifier core 502 may comprise one or more NMOS transistors that may be utilized for amplifying the input signal 514.

In one aspect of the invention, the amplifier core 502 may utilize the TW NMOS transistor TW to control one or more gain levels of the amplifier core 502. The source 518 and drain 520 of transistor NT may be coupled to inductors 505 and 504, respectively. The inductors 505 and 504 may be coupled to voltage rail 512 with supply voltage $V_{DD}$. Since transistor NT is an NMOS transistor, the gate voltage $V_G$ for gate 506 may be represented as $V_G=V_{DD}+V_T$, where $V_T$ is a determined threshold voltage. The gate 506, therefore, may be connected to a different supply voltage rail 513 in order for transistor NT to operate as a switch. The supply voltage rail 513 may utilize supply voltage $V_{DD1}$, where $V_{DD1}>V_{DD}$. In an exemplary aspect of the invention, $V_{DD}$ may be approximately 1.2V and $V_{DD1}$ may be approximately 2.5V, for example. A gain control signal 508 may be asserted on the gate 506 to enable or disable the transistor NT and to assert low or high gain on the incoming signal 514. The third well 510 of transistor NT may be connected to voltage supply rail 512 with voltage $V_{DD}$.

In operation, the amplifier core 502 may receive the incoming signal 514. If the incoming signal 514 comprises a weak desired signal, the gain control (GC) signal 508 may be asserted, for example, GC set to logic 1, by connecting the gate 506 of transistor NT to voltage rail 513 with voltage $V_{DD1}$ and the third well 510 to supply voltage rail 512 with voltage $V_{DD}$. If the gain control signal 508 is asserted, or GC is set to logic 1, the TW NMOS transistor NT will be turned on and the amplifier core 502 may assert low gain on the incoming signal 514. If the incoming signal 514 comprises a strong interference/blocker signal, the gain control signal 508 may be de-asserted, for example, GC set to logic 0, by disconnecting the gate 506 of transistor NT from voltage rail 513 with voltage $V_{DD1}$. If the gain control signal 508 is de-asserted, or GC is set to logic 0, the TW NMOS transistor NT will be turned off and the amplifier core 502 may assert high gain on the incoming signal 514.

In a different aspect of the invention, an amplifying circuit may utilize several TW NMOS transistors in order to achieve a well defined gain at more than two gain levels. For example, an amplifying circuit utilizing more than one TW NMOS transistors as gain control switches, may be characterized by a well defined high gain, low gain, as well as several well defined mid-gains, for example.

FIG. 5B is a circuit illustrating an amplifier circuit with a plurality of triple well (TW) NMOS transistors, in accordance with an embodiment of the invention. Referring to FIG. 5B, the amplifier circuit 550 may comprise inductors 555 and 554, TW NMOS transistors $NT_1$ through $NT_n$, and an amplifier core 552. The amplifier core 552 may comprise suitable circuitry and/or logic and may be adapted to receive an incoming signal 564, amplify the received signal, and generate an output signal 566. For example, the amplifier core 552 may comprise one or more NMOS transistors that may be utilized for amplifying the input signal 564.

In one aspect of the invention, the amplifier core 552 may utilize the TW NMOS transistors $NT_1$ through $NT_n$ to control a plurality of gain levels of the amplifier core 552. Source connections 568 through 576, and drain connections 570 through 578 of transistors $NT_1$ through $NT_n$ may be coupled to inductors 555 and 554, respectively. Inductors 555 and 554 may be coupled to voltage rail 562 with supply voltage $V_{DD}$. Since transistors $NT_1$ through $NT_n$ are NMOS transistors, the respective gate voltages $V_G$ for gates 556 through 574 may be represented as $V_G=V_{DD}+V_T$, where $V_T$ is a determined threshold voltage.

Gates 556 through 574, therefore, may be connected to a different supply voltage rail 563 in order for transistors $NT_1$ through $NT_n$ to operate as a switches for different gain levels of the amplifier core 552. The supply voltage rail 563 may utilize supply voltage $V_{DD1}$, where $V_{DD1}>V_{DD}$. In an exemplary aspect of the invention, $V_{DD}$ may be approximately 1.2V and $V_{DD1}$ may be approximately 2.5V, for example. Gain control signals 558 through 580 may be asserted on gates 556 through 574, respectively, to enable or disable transistors $NT_1$ through $NT_n$ and to assert low or high gain on the incoming signal 564. Third well connections 560 through 572 of transistors $NT_1$ through $NT_n$, respectively, may be connected to voltage supply rail 562 with voltage $V_{DD}$.

In operation, the amplifier core 552 may receive the incoming signal 564. If the incoming signal 564 comprises a weak desired signal, the gain control (GC) signals 558 through 580 may be asserted, for example, GC set to logic 1, by connecting the gates 556 through 574 of transistors $NT_1$ through $NT_n$ to voltage rail 563 with voltage $V_{DD1}$. Third well connections 560 through 572 may be connected to supply voltage rail 562 with voltage $V_{DD}$. If gain control signals 558 through 580 are asserted, TW NMOS transistors $NT_1$ through $NT_n$ will be turned off and the amplifier core 552 may assert high gain on the incoming signal 564. If the incoming signal 564 comprises a strong interference/blocker signal, gain control signals 558 through 580 may be de-asserted, for example, GC set to logic 0, by disconnecting gates 556 through 574 of transistors $NT_1$ through $NT_n$ from voltage rail 563 with voltage $V_{DD1}$. If gain control signals 558 through 580 are de-asserted, TW NMOS transistors $NT_1$ through $NT_n$ will be turned on and the amplifier core 552 may assert low gain on the incoming signal 564.

In a different aspect of the invention, one or more well defined gains within the amplifier core 552 may be asserted by utilizing different number of TW NMOS transistors. For example, by asserting different number of gain control signals and connecting different combination of gates from the plurality of gates 556 through 574, the amplifier core 552 may be characterized by several well defined mid gain levels, for example. In addition, one or more received signal strength indicators (RSSI) may be utilized to generate one or more gain control feedback signals based on the strength of an interference/blocker signal and/or a desired signal. The gain control feedback signals may then be communicated back to the LNA for gain adjustment.

Figure 6:
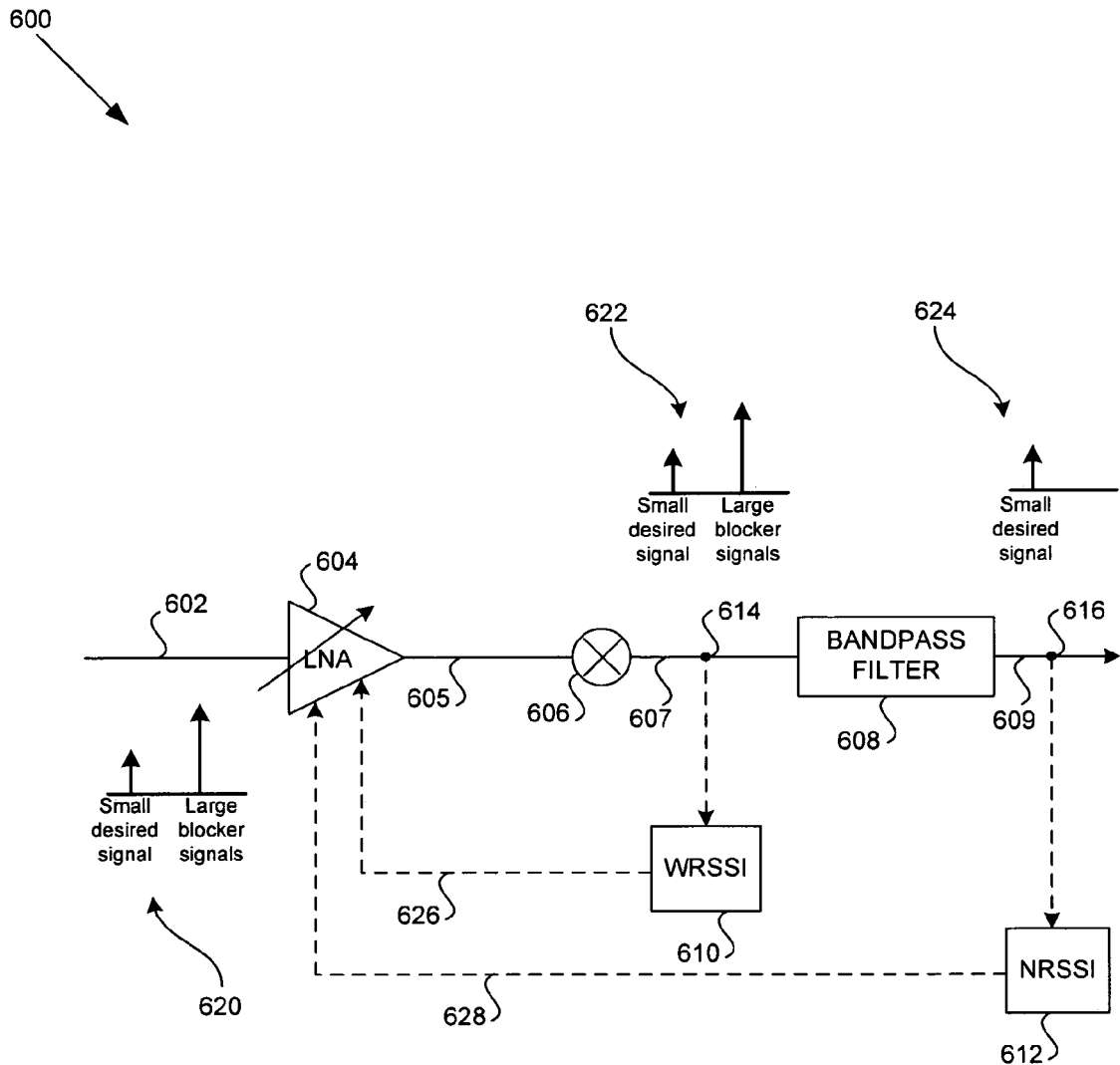
FIG. 6 is a circuit illustrating an adjustable gain amplifier utilizing a wideband received signal strength indicator (WRSSI) and a narrowband received signal strength indicator (NRSSI) that may be utilized in connection with an embodiment of the invention.

FIG. 6 is a circuit illustrating an adjustable gain amplifier utilizing a wideband received signal strength indicator (WRSSI) and a narrowband received signal strength indicator (NRSSI) that may be utilized in connection with an embodiment of the invention. Referring to FIG. 6, the adjustable gain amplifier circuit 600 may comprise an adjustable gain LNA 604, a downconversion mixer 606, a bandpass filter 608, a WRSSI 610, and a NRSSI 612.

The LNA 604 in the adjustable gain amplifier circuit 600 may comprise suitable circuitry and/or code and may be adapted to receive an input signal 602 and generate an amplified RF signal 605. The downconversion mixer 606 may comprise suitable circuitry and/or logic and may be adapted to receive the RF signal 605 and downconvert it to an intermediate frequency (IF)/baseband signal 607. The IF/baseband signal 607 may then be further filtered by the bandpass filter 608 to generate a filtered signal 609.

The WRSSI 610 and NRSSI 612 may comprise suitable circuitry and/or logic and may be adapted to measure signal strength and generate one or more gain control signals based on the measured signal strength. For example, the incoming signal 602 may comprise a small desired signal and a large interference/blocker signal, as illustrated by graph 620. After the incoming signal is amplified by the LNA 604, it may be downconverted by the downconversion mixer 606. The IF/baseband signal 607 may also comprise a small desired signal and a large interference/blocker signal, as measured at point 614 and illustrated by graph 622. A WRSSI 610 may be utilized at point 614 to measure wideband signal strength and generate a gain control signal 626 based on the signal strength of the small desired signal and a large interference/blocker signal.

After the IF/baseband signal 607 is filtered by the bandpass filter 608 and the filtered signal 609 is generated, a NRSSI 612 may be connected at point 616. The bandpass filter 608 may be adapted to filter out the large interference/blocker signal so that only the small desired signal remains in the signal spectrum of the filtered signal 609, as measured at point 616 and illustrated by graph 624. The NRSSI 612 may be utilized at point 616 to measure narrowband signal strength of the filtered signal 609 and generate a gain control signal 628 based on the signal strength of the small desired signal.

In operation, the LNA 604 may receive the incoming signal 602 and may amplify it to generate an RF signal 605. After the LNA 604 amplifies the input signal 602 and generates the RF signal 605, the downconversion mixer 606 may downconvert the RF signal 605 to IF/baseband signal 607. The IF/baseband signal 607 may then be filtered by the bandpass filter 608 to generate a filtered signal 609. The WRSSI 610 may be utilized at point 614 to measure wideband signal strength and generate a gain control signal 626 based on the signal strength of the small desired signal and a large interference/blocker signal, as measured at point 614. The NRSSI 612 may be utilized at point 616 to measure narrowband signal strength of the filtered signal 609 and generate a gain control signal 628 based on the signal strength of the small desired signal, as measured at point 616.

In one aspect of the invention, gain control signals 626 and 628 may be communicated back to the LNA 604 for gain adjustment. For example, gain control signal 626 may be based on the signal strength of the large interference/blocker signal, as measured at point 614. Similarly, gain control signal 628 may be based on the signal strength of the small desired signal, as measured at point 616. The LNA 604 may adjust signal gain based on the received gain control signals 626 and 628.

In another aspect of the invention, the LNA 604 may achieve well defined gain levels and reduced parasitic capacitance by using a TW NMOS transistor as a switch, as explained above with regard to FIGS. 5A and 5B. In this manner, by utilizing a gain control signal corresponding to a power status of the TW NMOS transistor, the LNA 604 may apply a maximum gain, if the input signal 602 comprises a weak desired signal, or a minimum gain, if the input signal 602 comprises a strong interference/blocker signal. If the LNA 604 utilizes a TW NMOS transistor for improved linearity and amplifier sensitivity, the adjustable gain amplifier circuit 600 may utilize one RSSI block, such as the NRSSI 612, and adjust the gain within LNA 604 through the gain control signal 628 received from the NRSSI 612.

Figure 7:
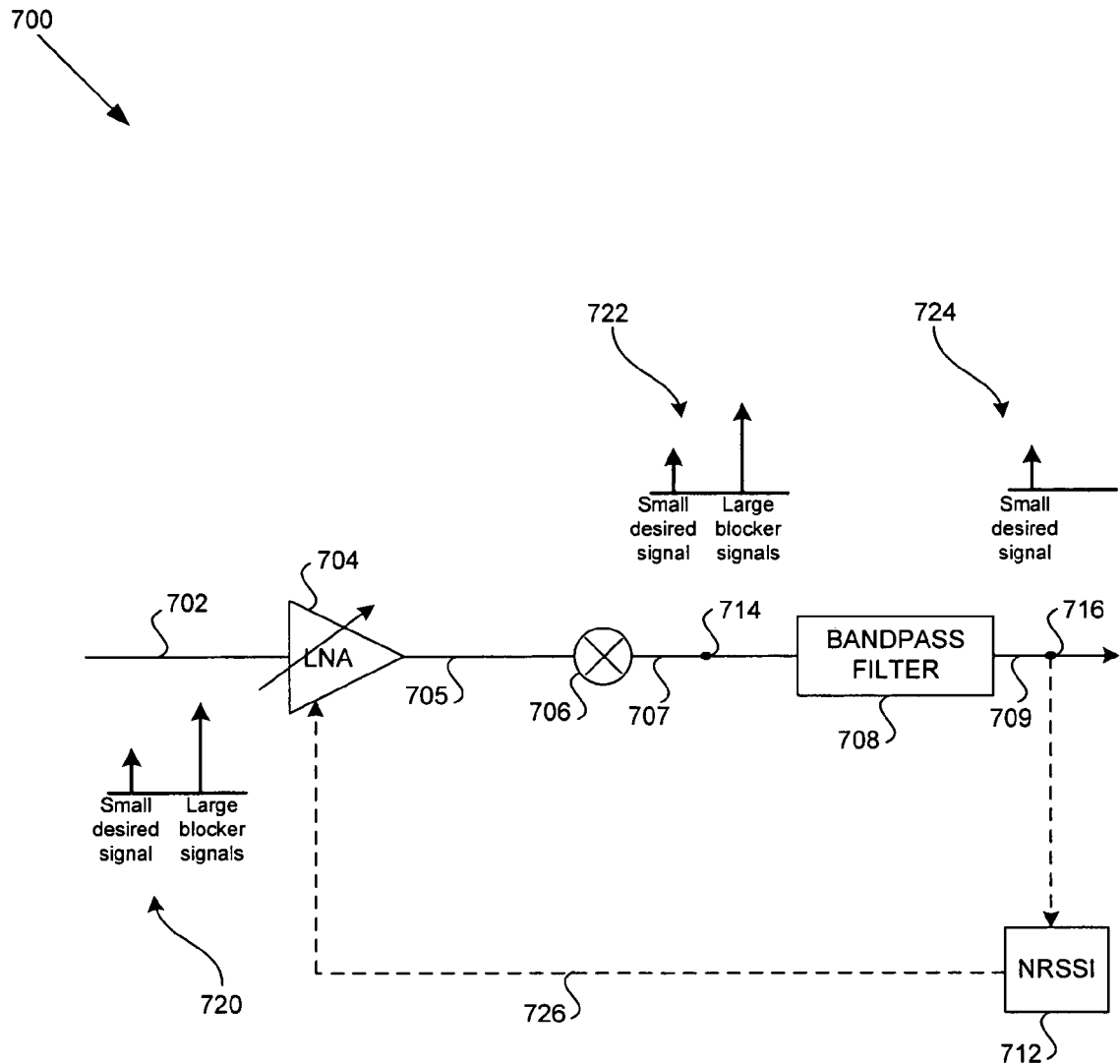
FIG. 7 is a circuit illustrating an adjustable gain amplifier with a well defined gain utilizing a narrowband received signal strength indicator (NRSSI), in accordance with an embodiment of the invention.

FIG. 7 is a circuit illustrating an adjustable gain amplifier with a well defined gain utilizing a narrowband received signal strength indicator (NRSSI), in accordance with an embodiment of the invention. Referring to FIG. 7, the adjustable gain amplifier circuit 700 may comprise an adjustable gain LNA 704, a downconversion mixer 706, a bandpass filter 708, and a NRSSI 712.

The LNA 704 in the adjustable gain amplifier circuit 700 may comprise suitable circuitry and/or logic and may be adapted to receive an input signal 702 and generate an amplified RF signal 705. In one aspect of the invention, the LNA 704 may comprise one or more NMOS transistors, such as TW NMOS transistors, that may be utilized by the amplifier core as a switch for triggering different gain levels. For example, a TW NMOS transistor utilized by the LNA 704 may be adapted to be turned on and off in accordance with a gain control signal, triggering low and high gain, respectively. The downconversion mixer 706 may comprise suitable circuitry and/or logic and may be adapted to receive the RF signal 705 and downconvert it to an intermediate frequency (IF)/baseband signal 707. The IF/baseband signal 707 may then be further filtered by the bandpass filter 708 to generate a filtered signal 709.

The NRSSI 712 may comprise suitable circuitry and/or logic and may be adapted to measure signal strength and generate one or more gain control signals based on the measured signal strength. For example, the incoming signal 702 may comprise a small desired signal and a large interference/blocker signal, as illustrated by graph 720. After the incoming signal is amplified by the LNA 704, it may be downconverted by the downconversion mixer 706. The IF/baseband signal 707 may also comprise a small desired signal and a large interference/blocker signal, as measured at point 714 and illustrated by graph 722. After the IF/baseband signal 707 is filtered by the bandpass filter 708 and the filtered signal 709 is generated, a NRSSI 712 may be connected at point 716. The bandpass filter 708 may be adapted to filter out the large interference/blocker signal so that only the small desired signal remains in the signal spectrum of the filtered signal 709, as measured at point 716 and illustrated by graph 712. The NRSSI 712 may be utilized at point 716 to measure narrowband signal strength of the filtered signal 709 and generate a gain control signal 726 based on the signal strength of the small desired signal.

In operation, the LNA 704 may receive the incoming signal 702 and may amplify it to generate an RF signal 705. After the LNA 704 amplifies the input signal 702 and generates the RF signal 705, the downconversion mixer 706 may downconvert the RF signal 705 to IF/baseband signal 707. The IF/baseband signal 707 may then be filtered by the bandpass filter 708 to generate a filtered signal 709. The NRSSI 712 may be utilized at point 716 to measure narrowband signal strength of the filtered signal 709 and generate a gain control signal 726 based on the signal strength of the small desired signal, as measured at point 716.

In one aspect of the invention, gain control signal 726 may be communicated back to the LNA 704 for gain adjustment. For example, gain control signal 726 may be based on the signal strength of the small desired signal, as measured at point 716. Since the LNA 704 utilizes a TW NMOS transistor and may be characterized by well defined gain and increased linearity, gain adjustment within the LNA 704 may be achieved by using only one RSSI block, such as the NRSSI 712. The LNA 704 may adjust signal gain based on the received gain control signal 726. For example, if signal strength of the small desired signal as measured at point 716 is below –102 dBm, for example, gain for LNA 704 may be adjusted to a maximum value. If signal strength of the small desired signal as measured at point 716 is between –102 dBm and –96 dBm, for example, gain for LNA 704 may be adjusted to a minimum, or a medium point. These threshold signal strength values are exemplary and the present inventions should not be limited in this manner. Other threshold values may also be utilized for LNA gain adjustment.

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing a plurality of signals, comprising:
    amplifying an input signal;
    bandpass filtering said amplified input signal; and
    adjusting amplification of said input signal based on only a narrowband received signal strength indication of said bandpass filtered amplified input signal.

2. The method according to claim 1, comprising downconverting said amplified input signal.

3. The method according to claim 1, comprising bandpass filtering at least one blocker signal from said amplified input signal.

4. The method according to claim 1, comprising measuring signal strength of at least one desired signal from said amplified input signal.

5. The method according to claim 1, comprising adjusting said amplification of said input signal utilizing a triple well (TW) NMOS transistor.

6. The method according to claim 1, comprising generating at least one control signal based on said narrowband received signal strength indication of said bandpass filtered amplified input signal.

7. The method according to claim 6, comprising adjusting said amplification of said input signal based on said generated at least one control signal.

8. The method according to claim 6, wherein said generated at least one control signal corresponds to a powering state of a TW NMOS transistor.

9. The method according to claim 4, comprising amplifying said input signal utilizing a determined first gain of a low noise amplifier (LNA), if said measured signal strength is below a first threshold value.

10. The method according to claim 9, comprising amplifying said input signal utilizing a determined second gain of a low noise amplifier (LNA), if said measured signal strength is above said first threshold value and below a second threshold value.

11. A system for processing a plurality of signals, comprising:
    a low noise amplifier (LNA) that amplifies an input signal; and
    a bandpass filter that bandpass filters said amplified input signal,
    wherein said LNA adjusts amplification of said input signal based on only a narrowband received signal strength indication of said bandpass filtered amplified input signal.

12. The system according to claim 11, comprising a downconversion mixer that downconverts said amplified input signal.

13. The system according to claim 11, wherein said bandpass filter bandpass filters at least one blocker signal from said amplified input signal.

14. The system according to claim 11, comprising a received signal strength indicator block that measures signal strength of at least one desired signal from said amplified input signal.

15. The system according to claim 11, wherein said LNA adjusts said amplification of said input signal utilizing a triple well (TW) NMOS transistor.

16. The system according to claim 14, wherein said received signal strength indicator block generates at feast one control signal based on said narrowband received signal strength indication of said bandpass filtered amplified input signal.

17. The system according to claim 16, wherein said LNA adjusts said amplification of said input signal based on said generated at least one control signal.

18. The system according to claim 16, wherein said generated at least one control signal corresponds to a powering state of a triple well (TW) NMOS transistor.

19. The system according to claim 14, wherein said LNA amplifies said input signal utilizing a determined first gain, if said measured signal strength is below a first threshold value.

20. The system according to claim 19, wherein said LNA amplifies said input signal utilizing a determined second gain, if said measured signal strength is above said first threshold value and below a second threshold value.

21. The system according to claim 11, wherein said LNA comprises a triple well (TW) NMOS transistor that tracks process and temperature variations (PVT).

* * * * *